(12) United States Patent
Fillion et al.

(10) Patent No.: US 6,396,153 B2
(45) Date of Patent: May 28, 2002

(54) CIRCUIT CHIP PACKAGE AND FABRICATION METHOD

(75) Inventors: Raymond Albert Fillion, Niskayuna; Ernest Wayne Balch, Ballston Spa, both of NY (US); Ronald Frank Kolc, Cherry Hill, NJ (US); William Edward Burdick, Jr., Niskayuna, NY (US); Robert John Wojnarowski, Ballston Lake, NY (US); Leonard Richard Douglas, Burnt Hills, NY (US); Thomas Bert Gorczyca, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/768,598

(22) Filed: Jan. 25, 2001

Related U.S. Application Data

(62) Division of application No. 09/411,101, filed on Oct. 4, 1999, now Pat. No. 6,242,282.

(51) Int. Cl.⁷ .................. H01L 23/48; H01L 23/52; H01L 29/40
(52) U.S. Cl. .................. 257/774; 257/773
(58) Field of Search .................. 257/532, 536, 257/700, 774, 773; 438/106, 118

(56) References Cited

U.S. PATENT DOCUMENTS

| | | | |
|---|---|---|---|
| 4,783,695 A | 11/1988 | Eichelberger et al. | |
| 4,933,042 A | 6/1990 | Eichelberger et al. | |
| 5,111,278 A | * 5/1992 | Eichelberger | |
| 5,250,843 A | * 10/1993 | Eichelberger | |
| 5,353,195 A | 10/1994 | Fillion et al. | |
| 5,353,498 A | 10/1994 | Fillion et al. | |
| 5,497,033 A | 3/1996 | Fillion et al. | |
| 5,527,741 A | 6/1996 | Cole et al. | |
| 5,576,925 A | 11/1996 | Gorowitz et al. | |
| 5,675,310 A | 10/1997 | Wojnarowski et al. | |
| 5,683,928 A | 11/1997 | Wojnarowski et al. | |
| 5,703,400 A | * 12/1997 | Wojnarowski et al. | |
| 5,736,448 A | 4/1998 | Saia et al. | |
| 5,774,326 A | 6/1998 | McConnelee et al. | |
| 5,874,770 A | 2/1999 | Saia et al. | |
| 5,973,908 A | * 10/1999 | Saia et al. | |
| 6,236,115 B1 | * 5/2001 | Gaynes et al. | 257/774 |
| 6,284,564 B1 | 9/2001 | Balch et al. | |
| 6,306,680 B1 | 10/2001 | Fillion et al. | |

\* cited by examiner

Primary Examiner—Amir Zarabian
Assistant Examiner—Bradley Smith
(74) Attorney, Agent, or Firm—Ann M. Agosti; Jill M. Breedlove

(57) ABSTRACT

One method for packaging at least one circuit chip includes: providing an interconnect layer including insulative material having a first side and a second side, initial metallization patterned on second side metallized portions of the second side and not on second side non-metallized portions of the second side, at least one substrate via extending from the first side to one of the second side metallized portions, and at least one chip via extending from the first side to one of the second side non-metallized portions; positioning the at least one circuit chip on the second side with at least one chip pad of the at least one circuit chip being aligned with the at least one chip via; and patterning connection metallization on selected portions of the first side of the interconnect layer and in the vias so as to extend to the at least one second side metallized portion and to the at least one chip pad. In related embodiments vias are pre-metallized and coupled to chip pads of the circuit chips by an electrically conductive binder. Thin film passive components and multilayer interconnections can additionally be incorporated into the package.

10 Claims, 10 Drawing Sheets

CIRCUIT CHIP PACKAGE AND FABRICATION METHOD

This application is a division of application Ser. No. 09/411,101, filed Oct. 4, 1999, now U.S. Pat. No. 6,242,282, which is hereby incorporated by reference in its entirely.

BACKGROUND

The invention relates generally to circuit chip packaging. In one form of high density interconnect (HDI) circuit module, an adhesive-coated polymer film overlay is applied over a substrate which can support integrated circuit chips in chip wells. Via openings are then formed to expose chip pads of the integrated circuit chips. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Generally a plurality of polymer film overlays and metallization patterns are used.

In another form of circuit module fabrication (referred to herein as chip on flex), as described by Cole et al., U.S. Pat. No. 5,527,741, issued Jun. 18, 1996, a method for fabricating a circuit module includes using a flexible interconnect layer having a metallized base insulative layer and an outer insulative layer. At least one circuit chip having chip pads is attached to the base insulative layer and vias are formed in the outer and base insulative layers to expose selected portions of the base insulative layer metallization and the chip pads. A substrate can be molded around the attached chip or chips. A patterned outer metallization layer is applied over the outer insulative layer extending through selected ones of the vias to interconnect selected ones of the chip pads and selected portions of the base insulative layer metallization. The concept of a pre-metallized flexible interconnect layer was extended as described by commonly assigned Saia et al., U.S. Pat. No. 5,874,770, wherein a method for fabricating a flexible interconnect film includes applying a resistor layer over one or both surfaces of a dielectric film; applying a metallization layer over the resistor layer; applying a capacitor dielectric layer over the metallization layer; and applying a capacitor electrode layer over the capacitor dielectric layer. The capacitor electrode layer is patterned to form a first capacitor electrode; the capacitor dielectric layer is patterned; the metallization layer is patterned to form a resistor; and the metallization layer and the resistor layer are patterned to form an inductor and a second capacitor electrode.

The chip on flex embodiments have been used to fabricate both single chip and multichip modules and represent a simplification of the earlier HDI processes. A drawback remains however due to the fact that the associated fabrication equipment and processes are not normally found in conventional contract component assembly facilities. For example, contract assemblers generally do not form vias or apply and pattern metal and may not be willing to invest in the equipment required for such steps, particularly in light of associated waste products and environmental regulations.

SUMMARY OF THE INVENTION

Therefore, it would be desirable to have a circuit chip package fabrication technique that is simpler for a contract component assembler to apply.

In one embodiment of the present invention the via formation is eliminated while in other embodiments metallization and patterning steps are additionally eliminated. These techniques, which can be used for single chip or multi-chip packages, offer the performance advantages of chip on flex with reduced equipment and processing step requirements and with less environmental concerns.

One method for packaging at least one circuit chip includes: providing an interconnect layer including insulative material having a first side and a second side, initial metallization patterned on second side metallized portions of the second side and not on second side non-metallized portions of the second side, at least one substrate via extending from the first side to one of the second side metallized portions, and at least one chip via extending from the first side to one of the second side non-metallized portions; positioning the at least one circuit chip on the second side with at least one chip pad of the at least one circuit chip being aligned with the at least one chip via; and patterning connection metallization on selected portions of the first side of the interconnect layer and in the vias so as to extend to the at least one second side metallized portion and to the at least one chip pad. In related embodiments vias are pre-metallized and coupled to chip pads of the circuit chips by an electrically conductive binder.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
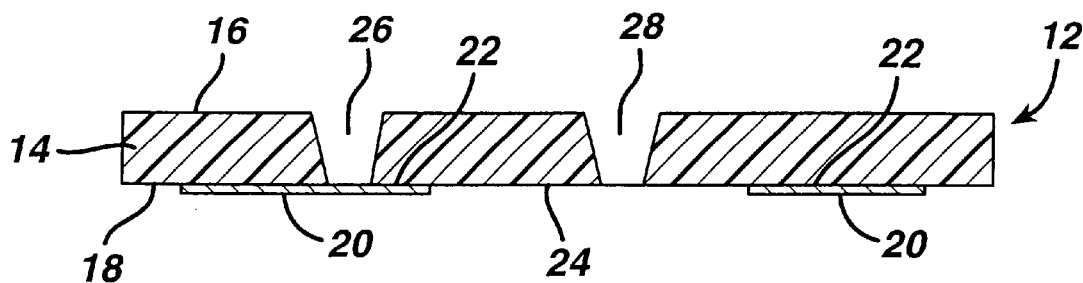
FIGS. 1–2 and 4–7 are sectional side views of stages in a fabrication sequence according to one circuit chip packaging embodiment of the present invention.
Figure 2:
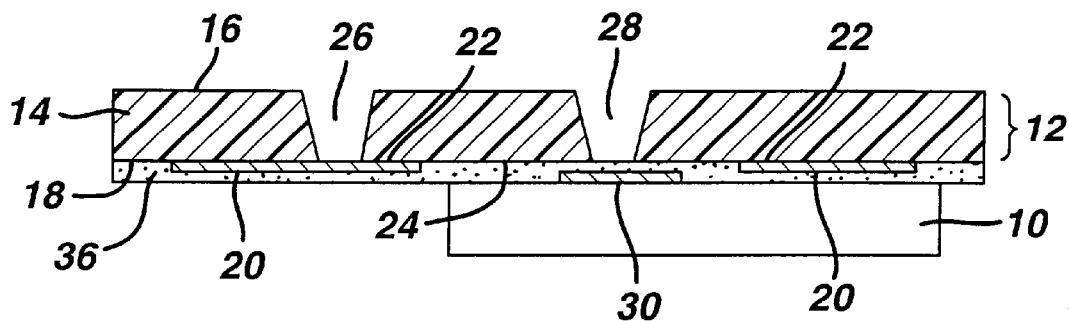
Figure 4:
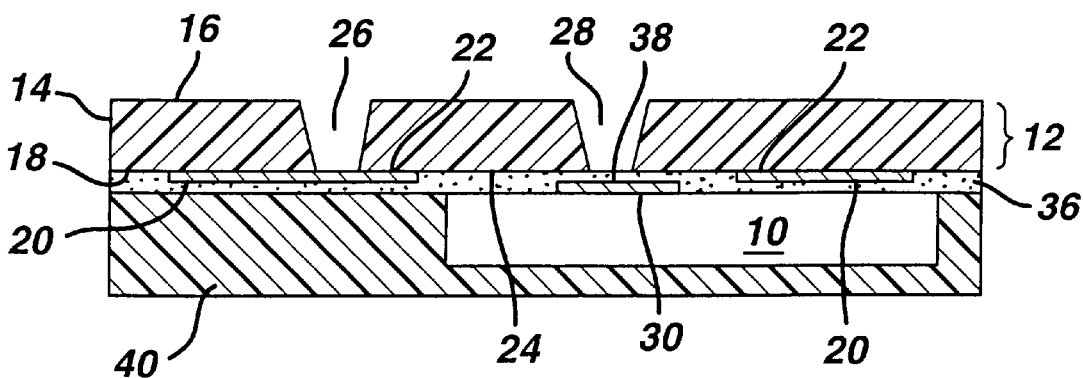
Figure 3:
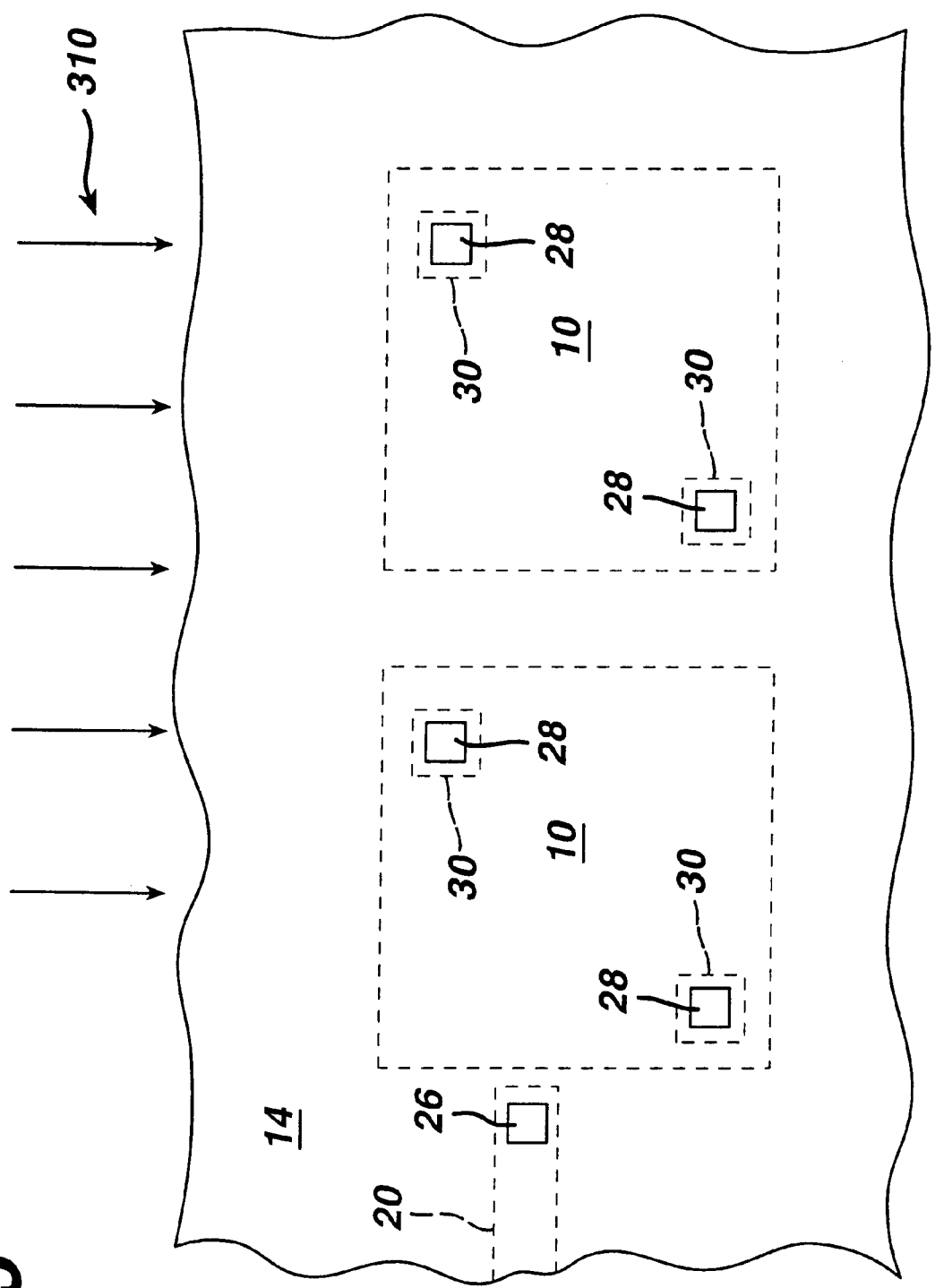
FIG. 3 is a partial top view of the sectional side view of FIG. 2.
Figure 5:
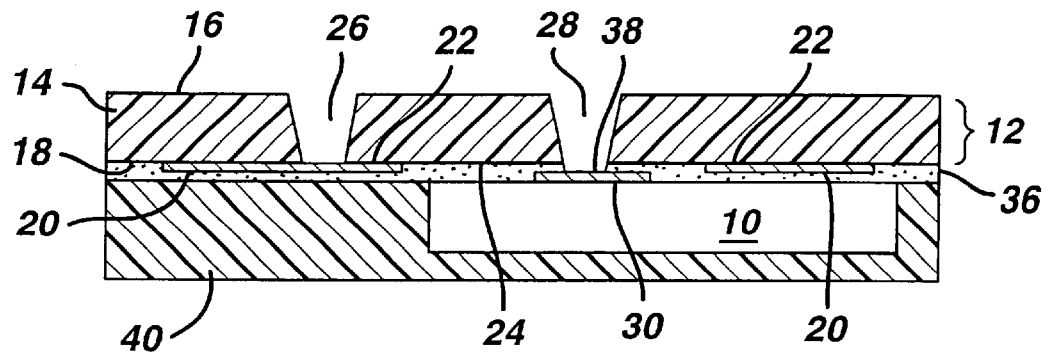
Figure 6:
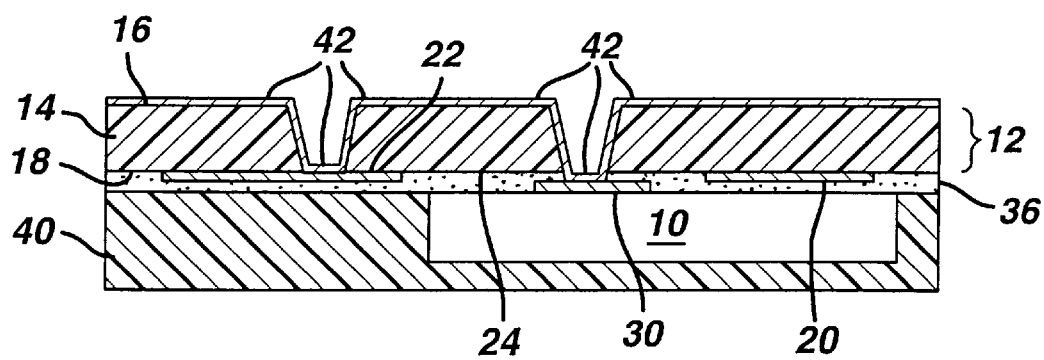
Figure 7:
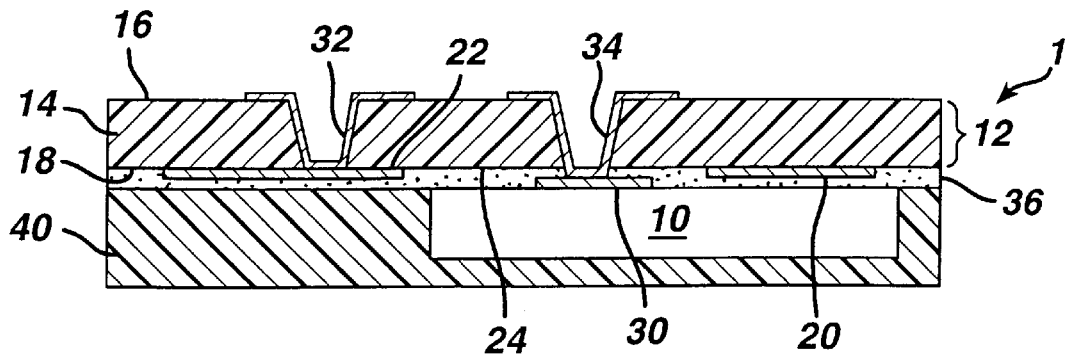
Figure 8:
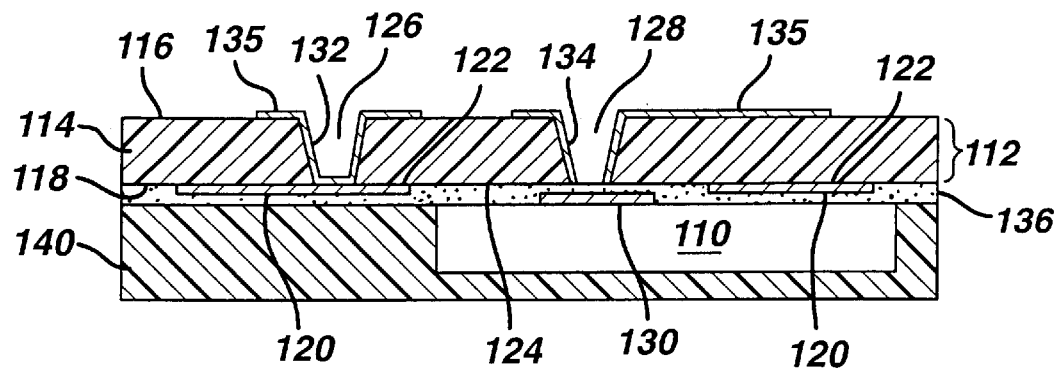
FIGS. 8–12 are sectional side views of stages in a fabrication sequence according to another circuit chip packaging embodiment of the present invention.

FIGS. 1–2 and 4–7 are sectional side views of stages in a fabrication sequence according to one circuit chip packaging embodiment 1 of the present invention, and FIG. 3 is a partial top view of the sectional side view of FIG. 2. In the fabrication sequence of FIGS. 1–7, a method for packaging at least one circuit chip 10 includes: providing an interconnect layer 12 including insulative material 14 having a first side 16 and a second side 18, initial metallization 20 patterned on second side metallized portions 22 of the second side and not on second side non-metallized portions 24 of the second side, at least one substrate via 26 extending from the first side to one of the second side metallized portions, and at least one chip via 28 extending from the first side to one of the second side non-metallized portions (FIG. 1); positioning the at least one circuit chip on the second side with at least one chip pad 30 of the at least one circuit chip being aligned with the at least one chip via (FIGS. 2–3); and patterning connection metallization on selected portions 32 and 34 of the first side of the interconnect layer and in the vias so as to extend to the at least one second side metallized portion and to the at least one chip pad (FIGS. 6–7).

FIG. 1 is a sectional side view of interconnect layer 12. Insulative material 14 may comprise polyimide, for example. Metallization 20 may comprise copper and may be applied and patterned on insulative material 14 by conventional techniques. Vias 26 and 28 likewise may be formed by conventional techniques such as laser ablation, for example.

FIG. 2 is a sectional side view of circuit chip 10 positioned on second side 18 of interconnect layer 12. The positioning can be achieved, for example, by applying a polymeric adhesive 36 between second side 18 and at least one circuit chip 10. In one embodiment, the adhesive comprises a polyetherimide, for example.

FIG. 3 is a partial top view of FIG. 2 illustrating an alignment embodiment. In the embodiment of FIG. 3, the at least one chip pad 30 comprises at least two chip pads 30, the at least one chip via 28 comprises at least two chip vias 28, and positioning includes using a vision system 310 (in one embodiment, a machine vision recognition system) to locally align at least two of the at least two chip pads with at least two of the at least two chip vias. Using at least two chip pads is useful for position and rotation alignment purposes. In one embodiment, the two chip pads are at opposite ends of the circuit chip to provide for more accurate rotation alignment. In one embodiment, interconnect layer 12 comprises a material that is sufficiently transparent to permit vision system 310 to visualize the chip pads 30 therethrough. This embodiment is useful because a single camera can be used for alignment purposes in contrast to embodiments requiring two or more cameras (one for the chip pad and one for the interconnect layer).

FIG. 4 further illustrates substrate molding material 40 formed around at least one circuit chip 10. The substrate molding material may comprise a plastic, for example, which can be formed by pour molding, transfer molding, injection molding or compression, for example. Methods of molding substrates are described, for example, in Fillion et al., U.S. Pat. No. 5,353,498. If adhesive 36 is applied between second side 18 and circuit chip 10, then the adhesive is removed from a surface 38 of the at least one chip pad prior to patterning connection metallization.

FIG. 5 illustrates the structure after the removal of residual adhesive from surface 38 as well as from any areas of via 128 sidewalls. The removal can be performed by a technique such as plasma, chemical, or laser etching, for example. Examples of etching systems include rf-plasma etching systems, such as reactive ion etching systems or Branson systems with oxygen gas plasmas, and pulsed excimer laser systems operating at 308 nm or 248 nm wavelengths.

FIGS. 6 and 7 illustrate connection metallization 42 and patterned portions 32 and 34 respectively. In one embodiment, after removing the polymeric adhesive from the surface of the at least one chip pad and prior to patterning connection metallization, a zincation process is applied through the substrate and chip vias to exposed areas of the one of the metallized portions of the second side and the at least one chip pad. For aluminum chip pads, the zincation bath acts to create a chemical replacement of a thin layer (generally less than about 0.5 micrometers) of aluminum and aluminum oxide on the chip pads. Patterning connection metallization can first include electrolessly depositing connection metallization 42 which can then be patterned by conventional techniques to form selected portions 32 and 34 of which extend to the at least one second side metallized portion and to the at least one chip pad. In one embodiment, the metallization comprises a first layer of titanium coated by a second layer of copper. Alternatives to the zincation/electroless deposition technique include other deposition techniques such as sputtering and electroplating, for example.

FIGS. 8–12 are sectional side views of stages in a fabrication sequence according to another circuit chip packaging embodiment 2 of the present invention.

In this embodiment, an interconnect layer 112 includes insulative material 114 having a first side 116 and a second side 118, second side metallization 120 patterned on second side metallized portions 122 of the second side and not on second side non-metallized portions 124 of the second side, at least one substrate via 126 extending from the first side to one of the second side metallized portions, at least one chip via 128 extending from the first side to one of the second side non-metallized portions, and first side metallization 132, 134, 135 patterned in the at least one substrate via and the at least one chip via and on selected portions of the first side.

In the embodiment of FIGS. 8–12, first side metallization, 132, 134, 135 is integral to interconnect layer 112 (that is, is patterned and part of layer 112 prior to the positioning of the at least one circuit chip on the second side). Again, the at least one chip pad 130 of the at least one circuit chip is aligned with the at least one chip via.

Figure 9:
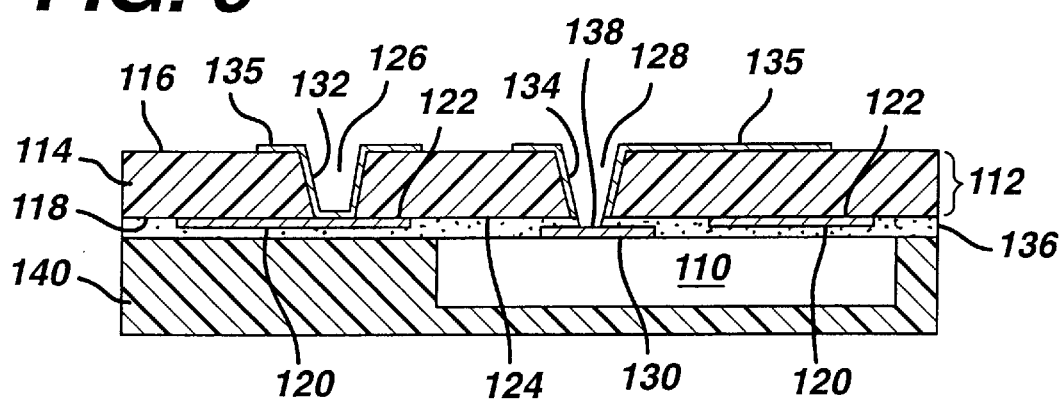

As discussed above, a vision system can be used to locally align at least two of the at least chip pads with at least two of the at least two chip vias, a substrate 140 can be molded around the at least one circuit chip, positioning the at least one circuit chip can include applying a polymeric adhesive 136 between the second side and the at least one circuit chip (and removed from surface 138 as shown in FIG. 9), and after removing the polymeric adhesive from the surface of the at least one chip pad and prior to applying the electrically conductive binder, a zincation process can be applied to the at least one chip pad.

Figure 10:
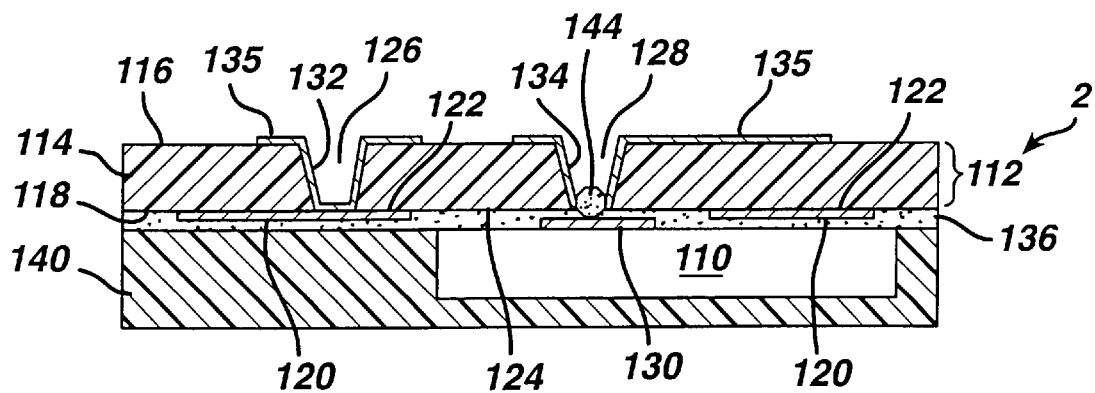

FIG. 10 illustrates the electrically conductive binder 144 which is used to form the electrical connection between the first side metallization and the chip pads. Electrically conductive binder 144 is applied in the at least one chip via to electrically couple the first side metallization and the at least one chip pad and may comprise a solder or an electrically conductive adhesive, for example. Typically, about one-quarter to about one-half of the volume of the at least one chip via will be filled with the conductive binder. In one embodiment, after removing the adhesive from the surface of the at least one chip pad and prior to applying the electrically conductive binder, a zincation process is applied to the at least one chip pad.

Figure 11:
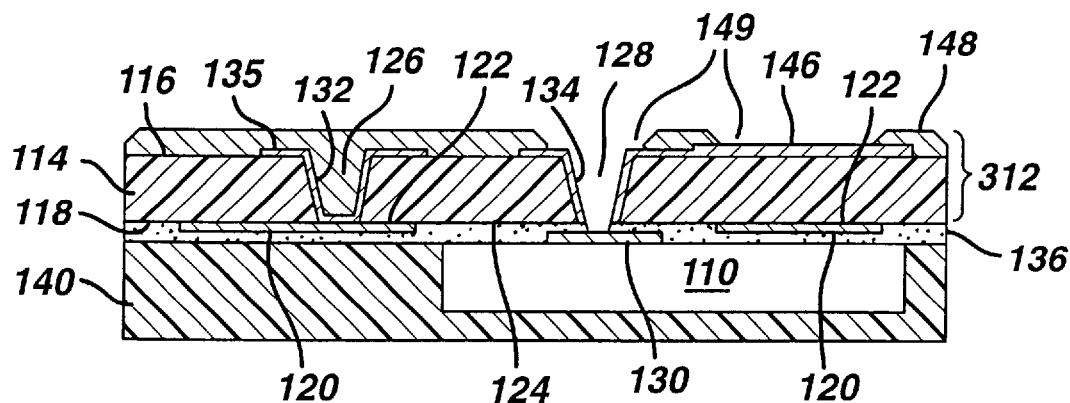
Figure 12:
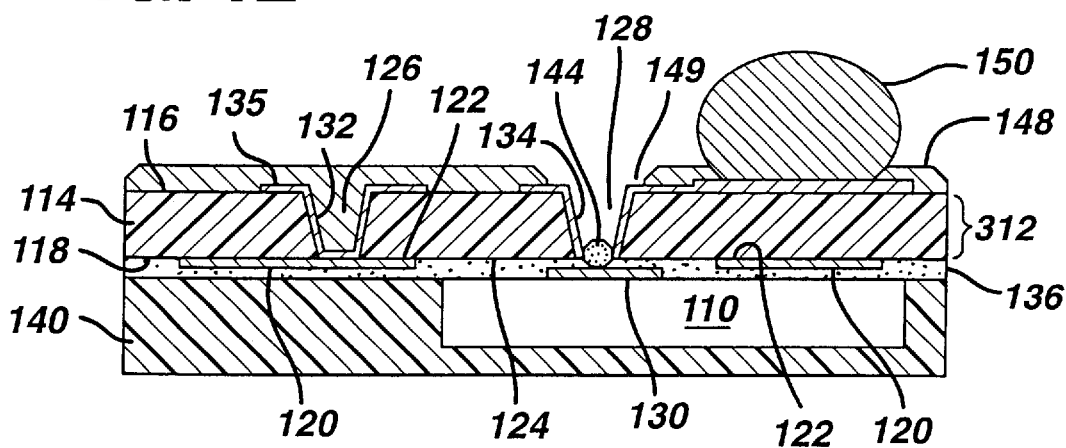
Figure 13:
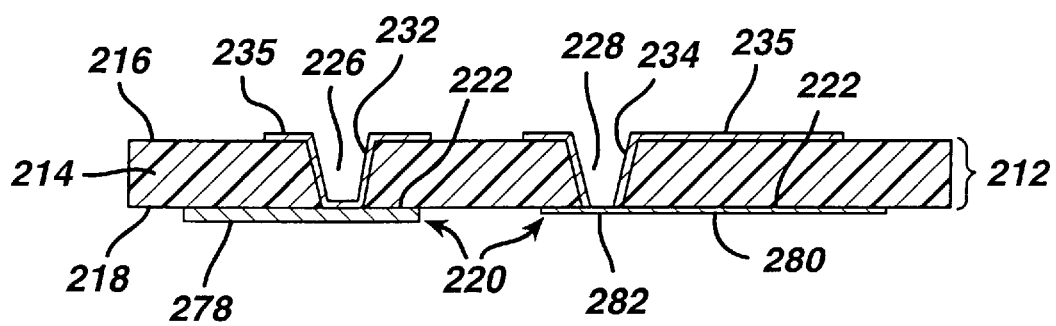
FIGS. 13–17 are sectional side views of stages in a fabrication sequence according to yet another circuit chip packing embodiment of the present invention.

FIG. 11 illustrates an embodiment wherein the interconnect layer 312 includes first side metallization including at least one patterned connection pad 146 and a passivation layer 148 over the first side and the first side metallization with openings 149 in the passivation layer over at least portions of the first side metallization in the at least one chip via and on the patterned connection pad. In one embodiment the passivation layer comprises a solder mask material. As shown in FIG. 12, a solder ball 150 can be coupled to the at least one patterned connection pad. If passivation layer 148 is present on interconnect layer 312 prior to attachment of circuit chip 110, then the materials of passivation layer 148 and any polymeric adhesive 136 should be carefully chosen so that removal of residual adhesive 136 leaves passivation layer 148 substantially intact. Example materials of passivation layer 148 include siloxane dielectrics such as siloxane polyimide and benzocyclobutene which tend "glass over" after application.

FIGS. 13–17 are sectional side views of stages in a fabrication sequence according to yet another circuit chip packing embodiment of the present invention. This embodiment is similar to that of FIGS. 8–12 except that an interconnect layer 212 includes second side metallization 220 patterned on second side metallized portions 222 of the second side with at least one thick second side metallized portion 278 being thicker than at least one thin second side metallized portion 280 and at least one chip via 228 extending to the at least one thin second side metallized portion. This embodiment is useful for preventing adhesive 236 from entering via 228.

Figure 14:
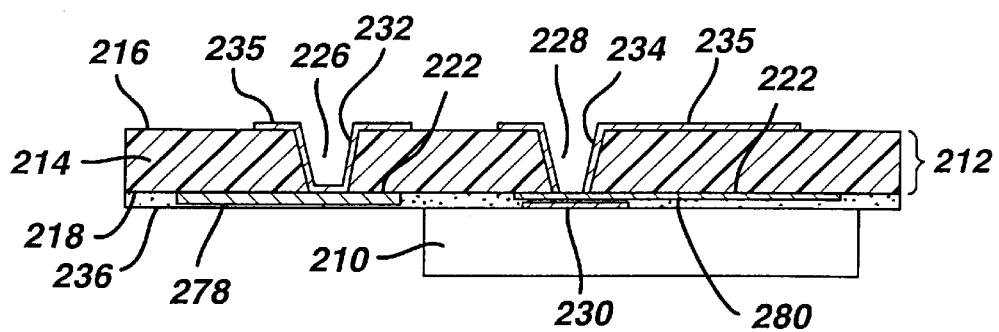
Figure 15:
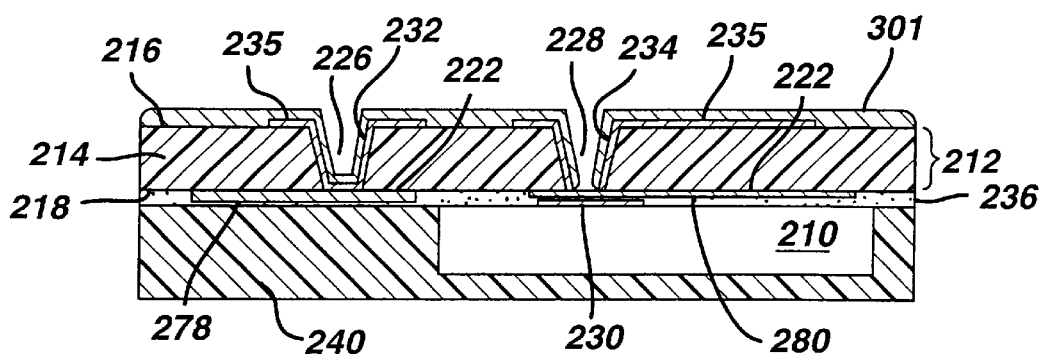
Figure 16:
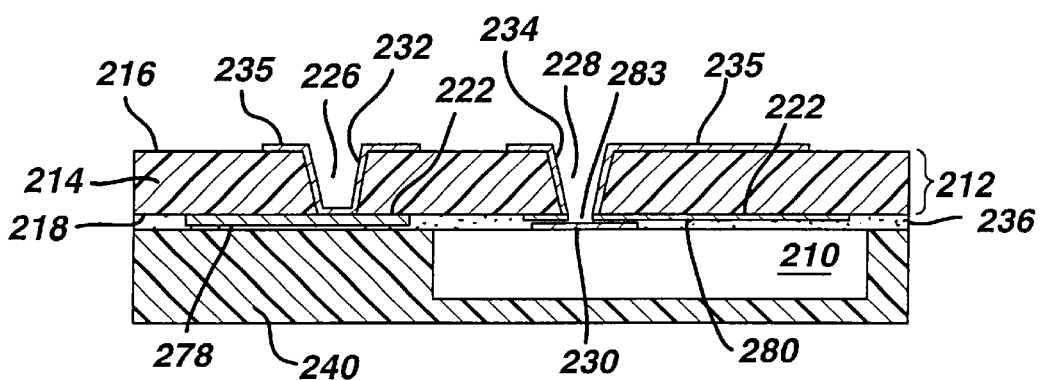
Figure 17:
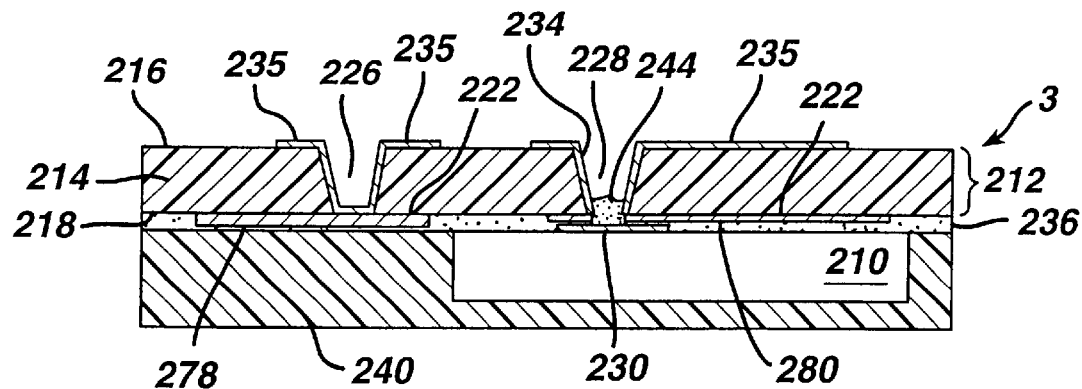

As shown in FIG. 14, the circuit chip 210 is positioned with at least one chip pad 230 being aligned with the at least one chip via. As shown in FIG. 15, at least part of the thin second side metallization 282 situated between the at least one chip via and the at least one chip pad is removed so that the electrically conductive binder 244 can be applied in the at least one chip via to electrically couple the first side metallization and the at least one chip pad.

Removing the at least part of the thin second side metallization may include etching. If desired, to protect the first side metallization while removing the at least part of the thin second side metallization, a passivation layer 301 (FIG. 15) can be applied (either prior to or after positioning chip 210). Like the earlier embodiments, adhesive 236 is removed from the surface of chip pad 30 to permit contact of electrically conductive binder 244.

Without a passivation layer, depending on the composition of the first and second side metallization layers, portions of the first side metallization may be removed at the same time as the second side metallization. In this situation, the first side metallization is formed to a sufficient thickness to retain integrity after such removal. Further, it can be useful to fill vias 128 completely with conductive binder 244 to enhance the connections.

Figure 18:
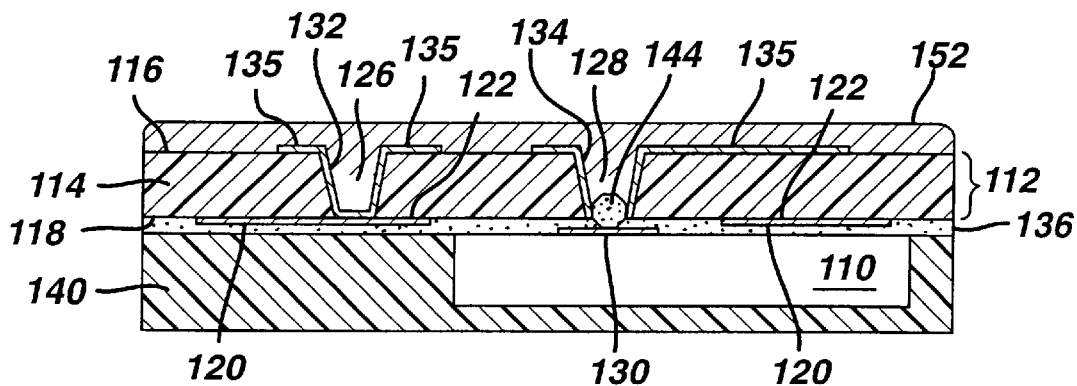
FIGS. 18–20 are sectional side views illustrating a multilayer interconnection fabrication process of the present invention.
Figure 19:
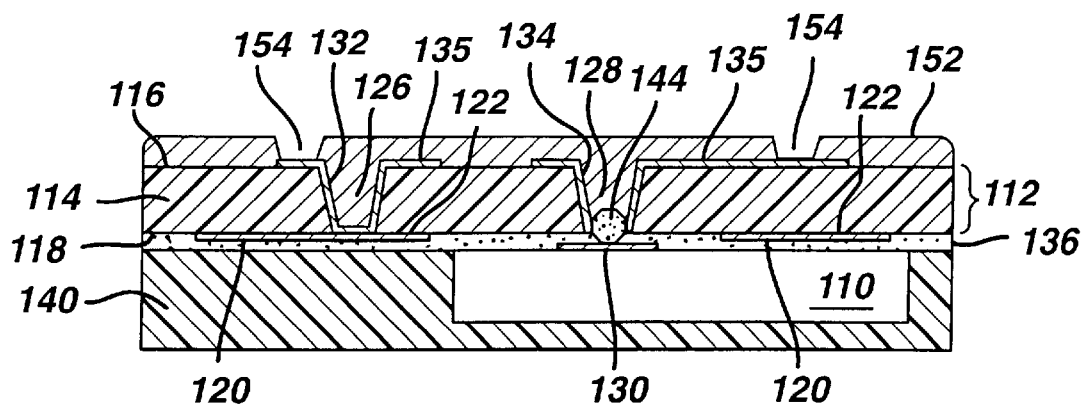
Figure 20:
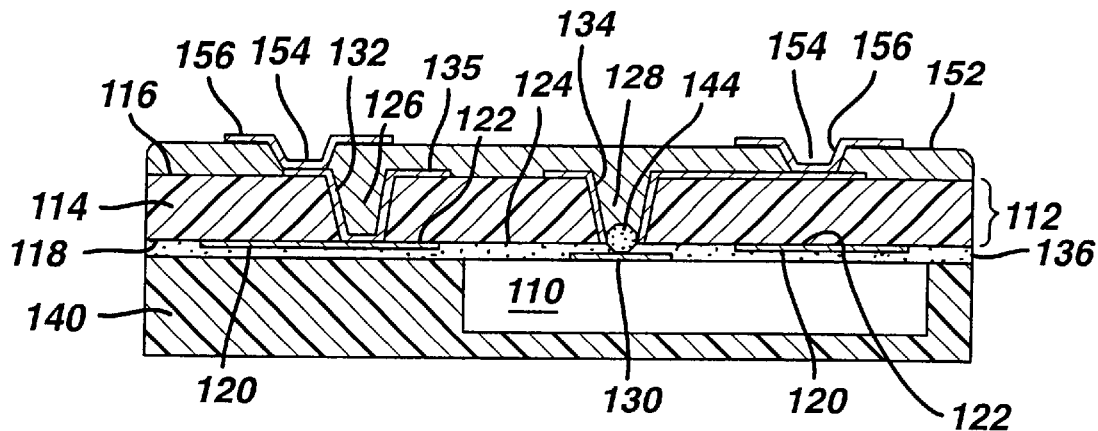

FIGS. 18–20 are sectional side views illustrating a multilayer interconnection fabrication process of the present invention. In these embodiments, dielectric layer 152 is applied over interconnect layer 112 and conductive binder 144 (by spray coating, spin coating, lamination, or extrusion), vias 154 (FIG. 19) are formed, and an outer metallization 156 is patterned in vias 154.

Figure 21:
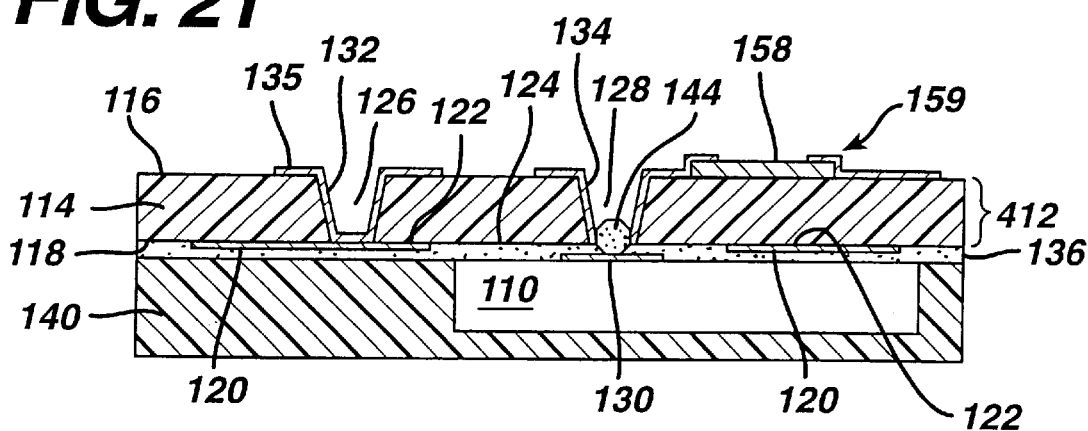
FIG. 21 is a sectional side view of an embodiment of the present invention including a thin film resistor.
Figure 22:
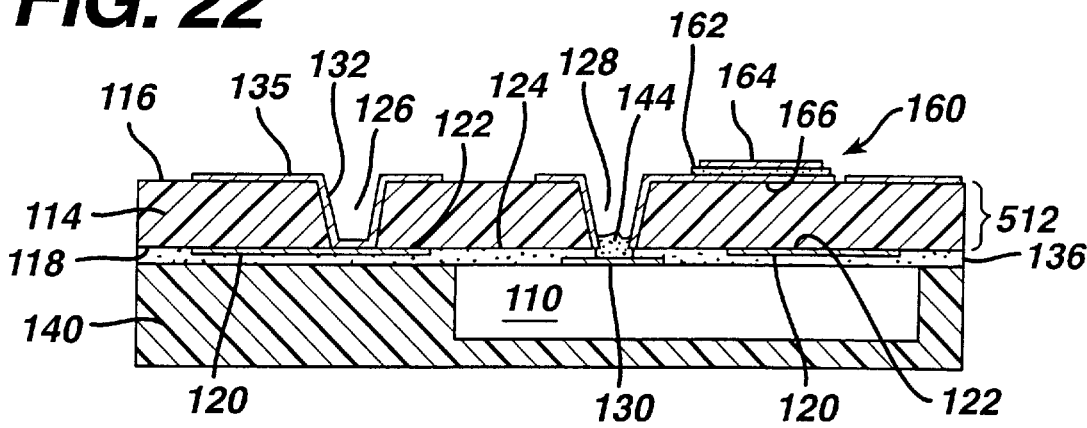
FIGS. 22–25 are sectional side views of stages in a fabrication sequence according to another circuit chip packing embodiment of the present invention including thin film capacitors.
Figure 23:
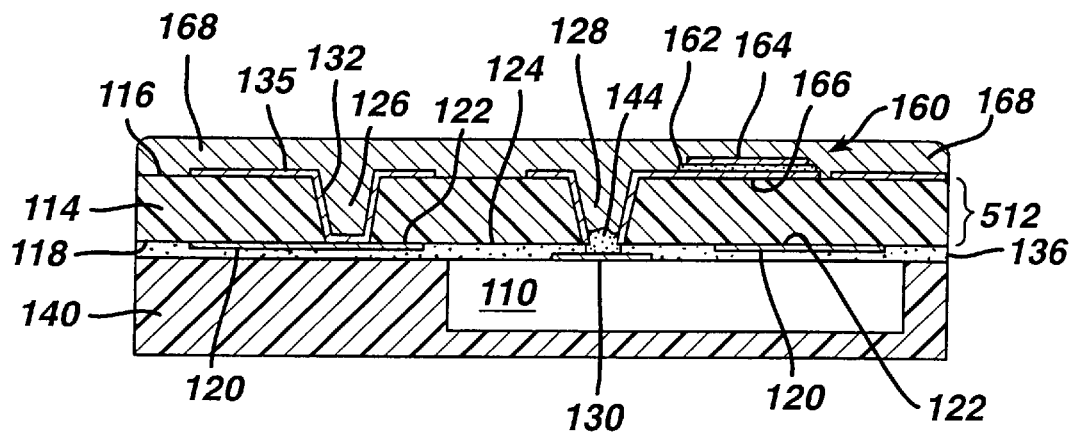
Figure 24:
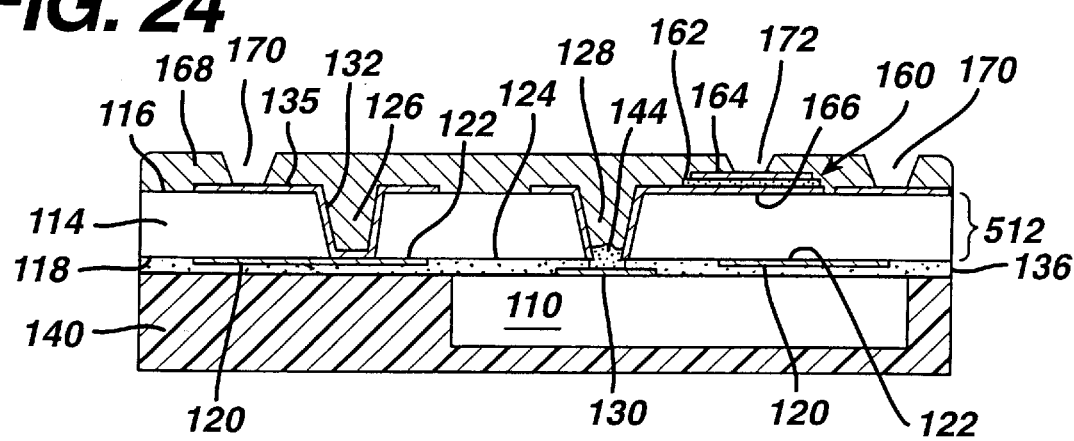
Figure 25:
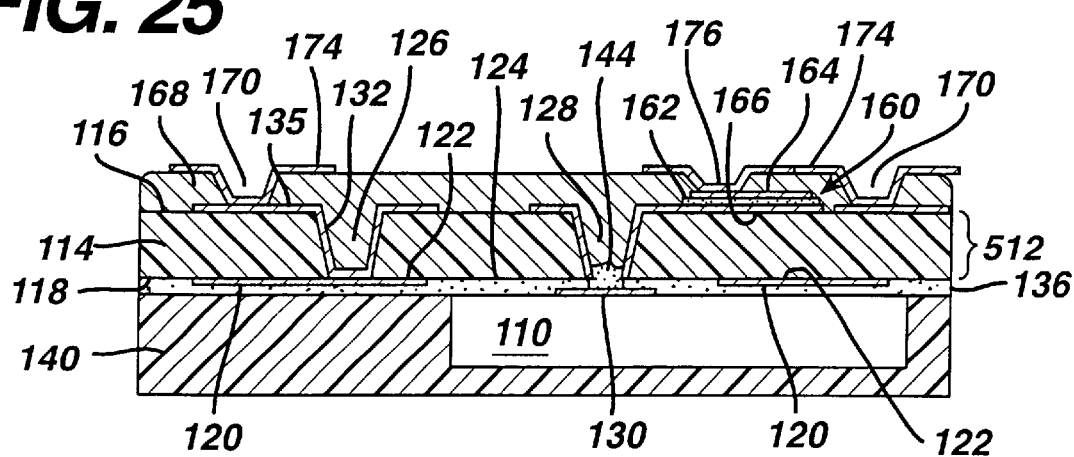
Figure 26:
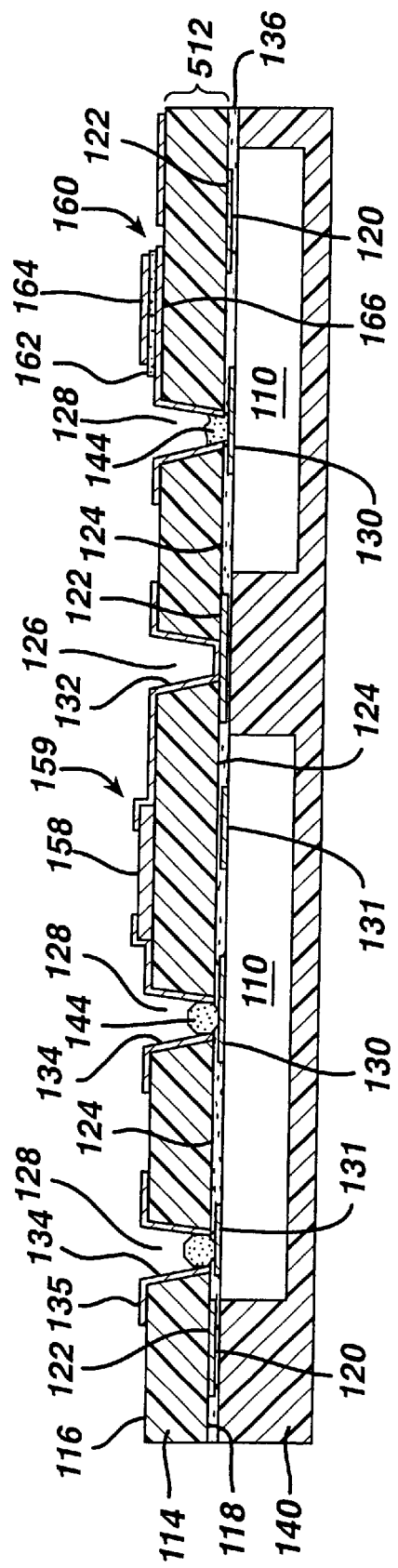
FIG. 26 is a sectional side view of an embodiment including several circuit chips as well as a resistor and a capacitor.

FIG. 21 is a sectional side view of an embodiment of the present invention including a thin film resistor, FIGS. 22–25 are sectional side views of stages in a fabrication sequence according to another circuit chip packing embodiment of the present invention including thin film capacitors, and FIG. 26 is a sectional side view of an embodiment including several circuit chips as well as a resistor and a capacitor. The thin film components can be fabricated on the interconnect layer either before or after the circuit chip is positioned on second side 18 of the interconnect layer.

Resistor 159 of FIGS. 21 and 26 comprises resistive material 158 such as tantalum nitride, for example, partially coated with first side metallization 134 or 135. Methods for fabricating thin film resistors are described, for example, in commonly assigned Wojnarowski et al., U.S. Pat. Nos. 5,675,310 and 5,683,928.

Capacitor 160 of FIGS. 22–26 may include electrodes comprising first side metallization 134 or 135 and additional metallization 164 with a dielectric layer 162 situated therebetween. In one embodiment the dielectric layer comprises amorphous hydrogenated carbon (commonly referred to as DLC or diamond like carbon). Methods for fabricating thin film capacitors are described for example, in commonly assigned Saia et al., U.S. Pat. No. 5,736,448. The capacitor can be coupled on the interconnect layer prior to attachment of chip 110 or, as shown in FIGS. 22–25, after the attachment of chip 100 through additional dielectric layer 168, vias 170 and 172, and additional metallization 174.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A package for at least one circuit chip comprising:
   an interconnect layer including insulative material having a first side and a second side, second side-metallization patterned on second side metallized portions of the second side and not on second side non-metallized portions of the second side, at least one substrate via extending from the first side to one of the second side metallized portions, at least one chip via extending from the first side to one of the second side non-metallized portions, and first side metallization patterned in the substrate via and the chip via and on selected portions of the first side, the circuit chip having at least one chip pad and being attached to the second side with the chip pad of the circuit chip being aligned with the chip via; and
   an electrically conductive binder in the chip via electrically coupling the first side metallization and the chip pad.

2. The package of claim 1 wherein the electrically conductive binder is solder or an electrically conductive adhesive.

3. The package of claim 2 further including a polymeric adhesive between the second side and the circuit chip.

4. The package of claim 3 further including a substrate surrounding the circuit chip.

5. The package of claim 2 wherein the first side metallization includes at least one patterned connection pad.

6. The package of claim 5 further including a passivation layer over the first side and the first side metallization with openings in the passivation layer over at least portions of the first side metallization in the chip via and on the patterned connection pad.

7. The package of claim 1 wherein the interconnect layer further includes a thin film resistor or capacitor.

8. A package for at least one circuit chip comprising:
   an interconnect layer including insulative material having a first side and a second side, second side metallization patterned on second side metallized portions of the second side with at least one thick second side metallized portion being thicker than at least one thin second side metallized portion and with the thin second side metallized portion having at least one thin second side metallized portion opening, at least one substrate via extending from the first side to the thick second side metallized portion, at least one chip via extending from the first side to the thin second side metallized portion, and first side metallization patterned in the substrate via and the chip via and on selected portions of the first side, the circuit chip including at least one chip pad and being attached to the second side with the chip pad of the circuit chip being aligned with the thin second side metallized portion opening; and an electrically conductive binder in the chip via electrically coupling the first side metallization and the chip pad.

9. The package of claim 8 wherein the electrically conductive binder is solder or an electrically conductive adhesive.

10. The package of claim 8 wherein the interconnect layer further includes a thin film resistor or capacitor.

* * * * *